United States Patent
Oo et al.

(10) Patent No.: US 7,358,876 B1
(45) Date of Patent: Apr. 15, 2008

(54) MIXED-MODE ANALOG OFFSET CANCELLATION FOR DATA CONVERSION SYSTEMS

(75) Inventors: Kenneth Thet Zin Oo, Milpitas, CA (US); Olakanmi Oluwole, San Jose, CA (US); Pierte Roo, Sunnyvale, CA (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 11/505,513

(22) Filed: Aug. 16, 2006

Related U.S. Application Data

(60) Provisional application No. 60/764,510, filed on Feb. 2, 2006.

(51) Int. Cl.
*H03M 1/06* (2006.01)
(52) U.S. Cl. .................. 341/118; 341/120; 341/155
(58) Field of Classification Search ........... 341/118, 341/120, 143, 155–172
See application file for complete search history.

(56) References Cited

U.S. PATENT DOCUMENTS

| | | | |
|---|---|---|---|
| 5,675,334 A * | 10/1997 | McCartney | 341/118 |
| 6,426,714 B1 * | 7/2002 | Ruha et al. | 341/143 |
| 6,433,711 B1 * | 8/2002 | Chen | 341/118 |
| 6,577,257 B2 * | 6/2003 | Brooks | 341/131 |
| 6,744,392 B2 * | 6/2004 | Melanson | 341/143 |
| 6,816,100 B1 * | 11/2004 | Galton et al. | 341/155 |
| 6,909,390 B2 * | 6/2005 | Khoini-Poorfard et al. | 341/144 |
| 7,030,798 B2 * | 4/2006 | Wang | 341/143 |
| 7,098,823 B2 * | 8/2006 | O'Dowd et al. | 341/118 |
| 7,098,824 B2 * | 8/2006 | Yang et al. | 341/131 |
| 7,173,558 B2 * | 2/2007 | Demirdag et al. | 341/172 |
| 7,176,822 B2 * | 2/2007 | Schimper | 341/143 |
| 7,218,258 B2 * | 5/2007 | Delanghe et al. | 341/118 |

* cited by examiner

*Primary Examiner*—Linh V. Nguyen

(57) ABSTRACT

A circuit includes a chopper switch to receive an analog input signal and output a first chopped signal of a first polarity during a first clock phase and a second chopped signal of a second polarity during a second clock phase. An analog block receives and processes the first and second chopped signals and outputs first and second processed signals, respectively. The analog bock has a first offset voltage associated thereto. The first and second processed signals, each includes a first offset component that is associated with the first offset voltage. A data converter receives and converts the first and second processed signals into first and second digital codes, respectively. An offset canceller receives the first and second digital codes. The offset canceller is configured to remove the first offset components from the first and second digital codes and output a digital output signal corresponding to the analog input signal.

31 Claims, 8 Drawing Sheets

MIXED-MODE ANALOG OFFSET CANCELLATION FOR DATA CONVERSION SYSTEMS

CROSS-REFERENCES TO RELATED APPLICATIONS

The present application claims benefit under 35 U.S.C. 119(e) of U.S. provisional application No. 60/764,510, filed on Feb. 2, 2006, entitled "Mixed-Mode Analog Offset Cancellation for Data Conversion Systems," which is incorporated by reference in its entirety.

BACKGROUND OF THE INVENTION

The present invention relates to electronic circuits, and more particularly to offset cancellation for data conversion systems.

In electronics, the circuits do not behave ideally. For example, an ideal amplifier should output no voltage when the input voltage is zero. However, the amplifiers in the real world output some voltages even when the input voltage is zero. That is, the amplifier behaves as if a "voltage" is being input even when the actual input voltage is zero. Such a "phantom input voltage" is commonly referred to as an offset voltage. The voltage output as a result of the offset voltage is referred to as an "offset component" or "offset" herein.

The offset voltage is in part a result of mismatches in differential circuit elements or any asymmetry along the differential path. Mismatches can be attributed to process variations (e.g., differences in device sizes and doping profiles) or signal integrity problems such as parasitic coupling and the like.

FIG. 1 illustrates a circuit 100 including dynamic element matching that is used to remove or reduce the offset by using a chopping technique. The differential signal is "chopped" before it passes through the analog circuitry that adds the offset. Chopping means swapping signals between two terminals or reversing the polarity every clock cycle to give an alternating signal (which appears like a square wave for a constant voltage signal). The chopped signal passes through the analog circuitry, with the offset being added to both the positive and negative portions. After passing through the analog circuitry, the signal is chopped again, to reverse the effect of the original chopping and return the signal to its original polarity. Since the added offset was the same for each clock cycle, the effect is that the signal has a positive offset one clock cycle, then a negative offset the next clock cycle. By then passing through a low pass filter, the offset is removed.

As shown in FIG. 1, circuit 100 includes an input chopper switch 102, an amplifier block 104 (whose offset is to be removed), an output chopper switch 106, and a low-pass filter 108. Input chopper switch 102 receives the input voltage $V_{in}$ (or input signal) and outputs a first chopped voltage $V_x$ (see FIG. 2A) to amplifier 104 that has an offset voltage $V_{os}$ associated with it. The voltage passing through the input to analog amplifier block 104 becomes a second voltage $V_y$ that is the sum of $V_x$ and the offset, $V_{os}$ (see FIG. 2B). The output of amplifier block 104 is an amplified version of the input signal with its offset, signal $V_z$ as shown in FIG. 2C. Output chopper switch 106 receives voltage $V_z$ output by the amplifier 104 and chops it to reverse the original chopping and output a fourth voltage $V'_{out}$, which is the original signal with the chopping removed and the offset being either positive or negative every other clock cycle. Fourth voltage $V'_{out}$ is passed through low-pass filter 108 to remove the offset component in fourth voltage $V'_{out}$. The resulting signal is an output voltage $V_{out}$ (or output signal).

FIGS. 2A-2E illustrate various waveforms associated with dynamic element matching circuit 100. FIG. 2A illustrates first signal $V_x$ that has been chopped-up by the input chopper switch 102. FIG. 2B illustrates second signal $V_y$ with the offset voltage $V_{os}$ added to the first signal $V_x$. FIG. 2C illustrates third signal $V_z$ that is output by amplifier 104 after the second signal $V_y$ has been amplified. FIG. 2D illustrates fourth signal $V'_{out}$ output by the output chopper switch 106. FIG. 2E illustrates output signal $V_{out}$ after the low-pass filter 108 has removed the offset component from fourth signal $V'_{out}$.

BRIEF SUMMARY OF THE INVENTION

Embodiments of the present invention relate to a mixed mode offset cancellation for data conversion systems. According to one embodiment of the present invention, the offset cancellation is performed in the digital domain to remove one or more offset components associated with the analog domain. The present offset cancellation technique uses input chopping in analog domain and the corresponding digital output code averaging to remove not only the offsets introduced in pre-stage analog blocks but also those associated with the data conversion blocks. The digital output code averaging corresponds to the functions performed by the output chopper switch and the low-pass filter in the conventional art. One advantage of the digital output code averaging technique is that the filtering to remove the chopping effect can now be done in the digital domain, removing the need for the area consuming capacitor of an analog filter.

In one embodiment, a circuit includes a chopper switch to receive an analog input signal and output a first chopped signal of a first polarity during a first clock phase and a second chopped signal of a second polarity during a second clock phase. An analog block receives and processes the first and second chopped signals and outputs first and second processed signals, respectively. The analog block has a first offset voltage associated therewith. The first and second processed signals, each includes a first offset component that is associated with the first offset voltage. A data converter receives and converts the first and second processed signals into first and second digital codes, respectively. An offset canceller receives the first and second digital codes and remove the first offset components from the first and second digital codes and output a digital output signal corresponding to the analog input signal.

In one embodiment, the offset canceller includes a first digital block to receive and output the second digital code. A second digital block receives the first digital code and outputs a complement of the first digital code. A third digital block to generate the output digital signal by adding a two's complement of the first digital code to the second digital code and dividing a resulting value of the addition by a predetermined integer. The predetermined integer is 2.

In one embodiment, the first digital block is a first flip-flop, the second digital block is a second flip-flop, and the third digital block is a summing circuit. The third digital block includes an adder to add the two's complement of the first digital code to the second digital code. The dividing is done by carrying out a Most Significant Bit (MSB) of the resulting value of the addition and dropping a Least Significant Bit (LSB) of the resulting value of the addition. The first and second digital blocks are first and second D flip-flops. Other types of flip-flops may be used in other implementations. The first D flip-flop has a non-inverting output in communication with a first input of the summing circuit and an enable node to receive the second clock phase. The second D flip-flop has an inverting output in communication with a second input of the adder and an enable node to receive the first clock phase.

In one embodiment, the data converter includes an analog-to-digital converter. The data converter has a second offset voltage associated therewith. The first and second digital codes each includes a second offset component associated with the second offset voltage. The offset canceller is configured to remove the second offset components from the first and second digital codes at the time the first offset components are removed from the first and second digital codes. The analog block includes an amplifier that amplifies the first chopped signal to the first processed signal and the second chopped signal to the second processed signal.

In another embodiment, a circuit includes a chopper switch to receive an analog input signal and output a first chopped signal of a first polarity during a first clock phase and a second chopped signal of a second polarity during a second clock phase. An analog block receives the first and second chopped signals and outputs a first processed signal of the first polarity and a second processed signal of the second polarity, respectively. The analog block has a first offset voltage associated therewith. The first and second processed signals each has a first offset component corresponding to the first offset voltage. A data converter receives and converts the first and second processed signals into first and second digital codes, respectively. The data converter has a second offset voltage associated therewith. The first digital code includes a first digital value associated with the first chopped signal, the first offset component associated with the first offset voltage, and a second offset component associated with the second offset voltage. The second digital code includes a second digital value associated with the second chopped signal, the first offset component, and the second offset component. An offset canceller receives the first and second digital codes and outputs a digital output signal corresponding to the analog input signal and without the first and second offset components.

In another embodiment, the offset canceller includes a first digital block to receive and output the second digital code. A second digital block receives the first digital code and output a complement of the first digital code. A third digital block generates the output digital signal by adding a two's complement of the first digital code to the second digital code and dividing a resulting value of the addition by a predetermined integer. The predetermined integer is 2. The first digital block is a first D flip-flop, the second digital block is a second D flip-flop, and the third digital block is a summing circuit. The first D flip-flop has a non-inverting output in communication with a first input of the summing circuit and an enable node to receive the second clock phase. The second D flip-flop has an inverting output in communication with a second input of the summing circuit and an enable node to receive the first clock phase.

In another embodiment, the third digital block has an adder to add binary 1 to the complement of the first digital code and generate the two's complement of the first digital code. The dividing is done by carrying out a Most Significant Bit (MSB) of the resulting value of the addition and dropping a Least Significant Bit (LSB) of the resulting value of the addition.

In another embodiment, the analog block includes an amplifier that amplifies the first chopped signal to the first processed signal and the second chopped signal to the second processed signal. The first digital value of the first digital code corresponds to a value of the first chopped signal that has been amplified by the amplifier. The second digital value of the second digital code corresponds to a value of the second chopped signal that has been amplified by the amplifier. The offset canceller has a subtractor to subtract the first digital code from the second digital code and a divider to divide a resulting value of the subtraction by a predetermined integer.

In another embodiment, a method includes chopping an analog input signal to output a first chopped signal of a first polarity during a first clock phase and a second chopped signal of a second polarity during a second clock phase. The first and second chopped signals are passed through an analog block to output first and second analog signals, respectively. The analog block has a first offset voltage associated therewith, the first and second analog signals each including a first offset component associated with the first offset voltage. The first and second analog signals are converted into first and second digital codes, respectively. The first offset components are removed from the first and second digital codes.

In another embodiment, the removing step includes providing a complement of the first digital code. A two's complement of the first digital code is added to the second digital code, and a resulting value of the addition is divided by a predetermined integer. The adding of the two's complement of the first digital code to the second digital code involves adding binary 1 to the complement of the first digital code. The predetermined integer is 2.

In another embodiment, the dividing step includes carrying out a Most Significant Bit (MSB) of the resulting value of the addition and dropping a Least Significant Bit (LSB) of the resulting value of the addition. The converting step has a second offset voltage associated therewith, the first and second digital codes each including a second offset component associated with the second offset voltage. The method further includes removing the second offset components from the first and second digital codes at the time the first offset components are removed from the first and second digital codes. The method further includes amplifying the first chopped signal to produce the first analog signal and the second chopped signal to produce the second analog signal. The method further includes subtracting the first digital code from the second digital code and dividing a resulting value of the subtraction by a predetermined integer.

In another embodiment, a method comprises chopping an analog input signal to produce a first chopped signal of a first polarity during a first clock phase and a second chopped signal of a second polarity during a second clock phase. Said first and second chopped signals are passed through an analog block to output a first analog signal of the first polarity and a second analog signal of the second polarity, respectively. The analog block has a first offset voltage associated therewith, the first and second analog signals each having a first offset component corresponding to the first offset voltage. The first and second analog signals are passed through a converter to generate first and second digital codes, respectively. The converter having a second offset voltage associated therewith. The first digital code includes a first digital value associated with the first chopped signal, the first offset component associated with the first offset voltage, and a second offset component associated with the second offset voltage. The second digital code includes a second digital value associated with the second chopped signal, the first offset component, and the second offset component. The first and second offset components are substantially cancelled from said digital codes.

In another embodiment, the substantially canceling includes providing a complement of the first digital code, adding a two's complement of the first digital code to the second digital code, and dividing a resulting value of the addition by a predetermined integer. The adding step includes adding binary 1 to the complement of the first digital code. The dividing comprises carrying out a Most Significant Bit (MSB) of the resulting value of the addition and dropping a Least Significant Bit (LSB) of the resulting value of the addition. The method further includes amplifying the first chopped signal to produce the first analog signal and the second chopped signal to produce the second analog signal. The substantially canceling includes subtracting the first digital code from the second digital code and dividing a resulting value of the subtraction by 2.

In another embodiment, a data conversion system includes means for chopping an analog input signal to output a first chopped signal of a first polarity during a first clock phase and a second chopped signal of a second polarity during a second clock phase; means for passing the first and second chopped signals through an analog block and outputting first and second analog signals, respectively, the analog block having a first offset voltage associated therewith, the first and second analog signals each including a first offset component associated with the first offset voltage; means for converting the first and second analog signals into first and second digital codes, respectively; and means for removing the first offset components from the first and second digital codes.

In another embodiment, the means for removing includes means for providing a complement of the first digital code, means for adding a two's complement of the first digital code to the second digital code, and means for dividing a resulting value of the addition by a predetermined integer. The means for adding adds binary 1 to the complement of the first digital code, wherein the predetermined integer is 2. The means for dividing carries out a Most Significant Bit (MSB) of the resulting value of the addition and drops a Least Significant Bit (LSB) of the resulting value of the addition.

In another embodiment, the converting means has a second offset voltage associated therewith, the first and second digital codes each including a second offset component associated with the second offset voltage.

In another embodiment, the data conversion system further includes means for removing the second offset components from the first and second digital codes at the time the first offset components are removed from the first and second digital codes. The data conversion system further includes means for amplifying the first chopped signal to produce the first analog signal and the second chopped signal to produce the second analog signal.

In another embodiment, the data conversion system further includes the means for subtracting the first digital code from the second digital code and means for dividing a resulting value of the subtraction by a predetermined integer.

In yet another embodiment, a data conversion system includes means for chopping an analog input signal to produce a first chopped signal of a first polarity during a first clock phase and a second chopped signal of a second polarity during a second clock phase; means for passing said first and second chopped signals through an analog block and outputting a first analog signal of the first polarity and a second analog signal of the second polarity, respectively, the analog block having a first offset voltage associated therewith, the first and second analog signals each having a first offset component corresponding to the first offset voltage; means for passing the first and second analog signals through a converter and generating first and second digital codes, respectively, the converter having a second offset voltage associated therewith, the first digital code including a first digital value associated with the first chopped signal, the first offset component associated with the first offset voltage, and a second offset component associated with the second offset voltage, the second digital code including a second digital value associated with the second chopped signal, the first offset component, and the second offset component; and means for substantially canceling the first and second offset components from said digital codes.

In yet another embodiment, the means for substantially canceling provides a complement of the first digital code, adds a two's complement of the first digital code to the second digital code, and divides a resulting value of the addition by a predetermined integer. The means for adding adds binary 1 to the complement of the first digital code. The means for dividing carries out a Most Significant Bit (MSB) of the resulting value of the addition and drops a Least Significant Bit (LSB) of the resulting value of the addition.

In yet another embodiment, the data conversion system further comprises means for amplifying the first chopped signal to produce the first analog signal and the second chopped signal to produce the second analog signal. The means for substantially canceling subtracts the first digital code from the second digital code and divides a resulting value of the subtraction by 2.

DETAILED DESCRIPTION OF THE INVENTION

The present invention relates to a data conversion system that converts data from one format to another format, e.g., from analog signals to digital code. The digital code outputted by the data conversion system is transferred to other digital circuits to be used or processed therein. Embodiments of the present invention are directed to removing one or more offset components associated with the analog circuits in the digital domain. In one embodiment, the offset cancellation technique uses input chopping in the analog domain and the corresponding digital output code averaging to remove both the offsets introduced by pre-stage analog blocks and those introduced by the data conversion blocks.

Figure 1:
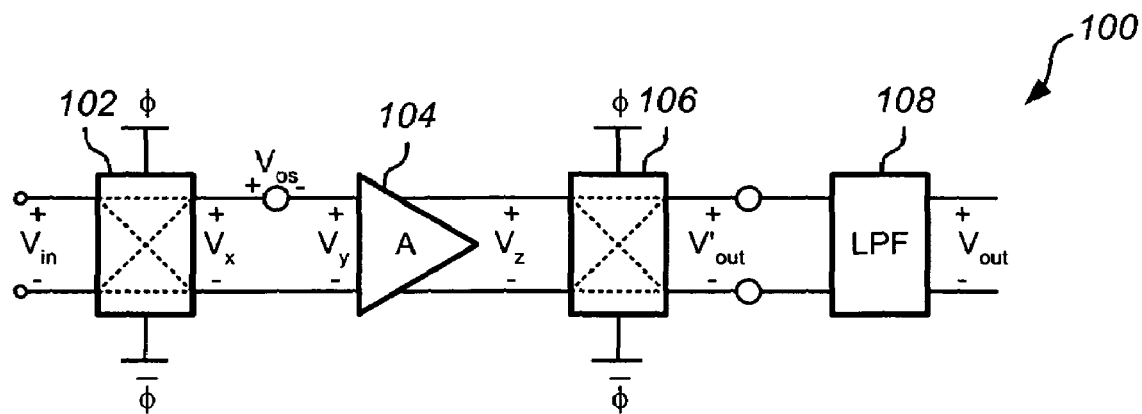
FIG. 1 illustrates a dynamic element matching circuit that is used to remove or reduce the offset by using a chopping technique.
Figure 3A:
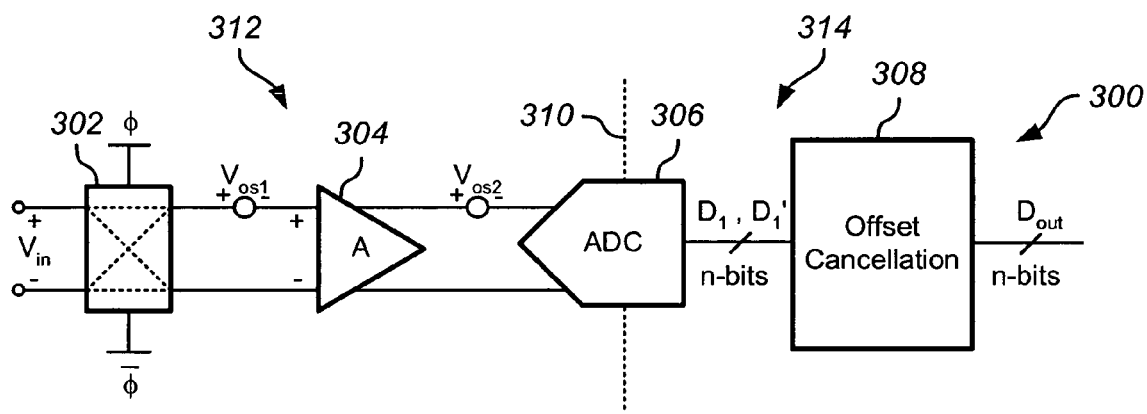
FIG. 3A is a simplified high level block diagram of a data conversion system according to one embodiment of the present invention.

FIG. 3A is a simplified high level block diagram of a system 300 according to one embodiment of the present invention. System 300 includes an analog chopper switch 302, an analog block 304, an analog-to-digital converter (ADC) 306, and an offset cancellation circuit 308. The offset cancellation circuit 308 performs the digital output code averaging that corresponds to the functions performed by output chopper switch 106 and low-pass filter 108 in FIG. 1. A first offset voltage $V_{os1}$ represents offsets associated with analog block 304. A second offset voltage $V_{os2}$ represents offsets associated with ADC 306. A dotted line 310 illustrates separation between the analog domain 312 and the digital domain 314.

Analog block 304 may be an amplifier, filter, oscillator, phase-locked loop, mixer, comparators, or other type of analog circuit. Analog block 304 may also be an analog system or circuit including a plurality of analog components. For illustrative convenience, analog block 304 will be described as an analog linear amplifier herein. The invention, however, may be implemented using other analog circuits or systems.

In the present implementation, data conversion system 300 is configured to receive analog signals and output digital codes. System 300 uses a mixed-mode offset-cancellation technique to simultaneously remove the offsets associated with analog linear amplifier 304 and ADC 306. Filtering in digital domain 314 allows for robust filtering and eliminates the need for an analog low-pass filter. The analog low-pass filter generally includes a capacitor that requires a sizable amount of real estate to implement, which may not be desirable in certain applications.

The present technique uses input chopping in analog domain 312 and digital code averaging in digital domain 314 to remove the offsets associated with the pre-stage analog blocks and the data conversion blocks. For example, the analog-to-digital converter 306 generally includes a comparator that adds an offset.

In operation, analog chopper switch 302 receives an input voltage $V_{in}$, i.e., an analog input signal. The input voltage is chopped up by continuously switching the switches in the analog chopper 302 switch between a first position and a second position according to clock signals.

Figure 3B:
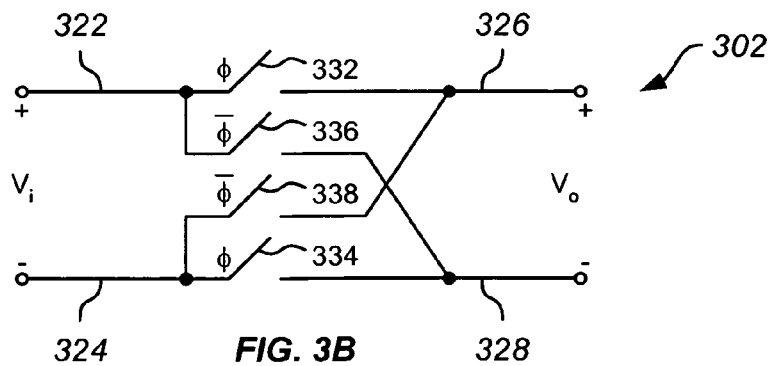
FIG. 3B illustrates chopper switch according to one implementation.

FIG. 3B illustrates chopper switch 302 according to one implementation. Chopper switch 302 includes a positive input 322 and a negative input 324. A positive output 326 is coupled to a non-inverting (+) input of amplifier 304, and a negative output 328 is coupled to an inverting (−) input of amplifier 304. Four switches 332, 334, 336, and 338 define two pairs of switches. Switches 332 and 334 form a first pair of switches that are turned on at a first clock phase Φ (e.g., odd clock cycles). Switches 336 and 338 form a second pair of switches that are turned on at a second clock phase Φ' (e.g., even clock cycles). These switches may be implemented using transistors.

In the first position, the first pair of switches 332 and 334 connect the positive input 322 of the chopper switch 302 to the non-inverting (+) input of amplifier 304, and the negative input 324 of the chopper switch 302 to the inverting input (−) of amplifier 304. In the second position, the second pair of switches 326 and 328 connect the positive input 322 of the chopper switch 302 to the inverting (−) input of amplifier 304 and the negative input 324 of the chopper switch 302 to the non-inverting (+) input of amplifier 304.

Amplifier 304 receives the signal that has been chopped-up by the chopper switch 302 for amplification. Since amplifier 304 has first offset voltage $V_{os1}$, the amplifier 304 also amplifies first offset voltage $V_{os1}$. Accordingly, amplifier 304 outputs $A(V_{in}-V_{os1})$ during the first clock phase Φ and $-A(V_{in}+V_{os1})$ during the second clock phase Φ'.

ADC 306 receives the amplified analog signals $A*V_{in}-A*V_{os1}$ and $-A*V_{in}-A*V_{os1}$ from the amplifier 304. ADC 306 has analog components, e.g., a comparator to compare an input analog signal with a reference signal. Such a component adds offsets. Second offset voltage $V_{os2}$ represents the offsets in ADC 306. Accordingly, ADC 306 converts the analog signals $A*V_{in}-A*V_{os1}-V_{os2}$ and $-A*V_{in}-A*V_{os1}-V_{os2}$ to digital codes.

Offset cancellation circuit 308 receives the converted digital codes from the ADC 306, e.g., first and second digital codes D1 and D1'. First digital code D1 corresponding to the analog signal $A*V_{in}-A*V_{os1}-V_{os2}$ is received during the first clock phase Φ. Second digital code D1' corresponding to the analog signal $-A*V_{in}-A*V_{os1}-V_{os2}$ is received during second clock phase Φ'. According to implementation, the digital codes may correspond to analog signals $A*V_{in}+A*V_{os1}+V_{os2}$ and $-A*V_{in}+A*V_{os1}+V_{os2}$. $A*V_{in}$ represents the input signal that has been amplified, $A*V_{os1}$ represents the first offset component, and $V_{os2}$ represents the second offset component.

Offset cancellation circuit 308 is configured to remove the offset components, i.e., $A*V_{os1}$ and $V_{os2}$, in the digital codes. In the present embodiment, the first and second digital codes D1 and D1' are subtracted and divided by 2 to remove these offset components. The resulting value is the desired digital representation of the amplified input signal, i.e., a digital output code $D_{out}$ with the offset components removed (or significantly reduced). Digital output code $D_{out}$ accurately reflects the desired digital representation as along as the offset is not too big and does not exceed the output code range. Digital output code $D_{out}$ is transferred to other digital circuits, so that it may be used or processed therein.

Figure 2A:
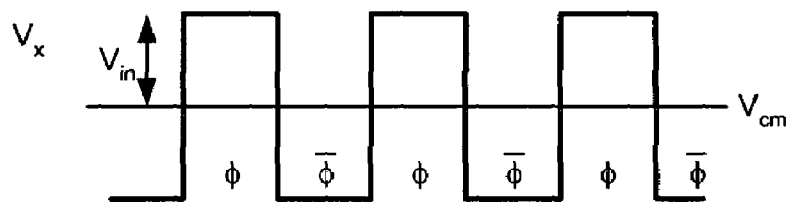
FIGS. 2A-2E illustrate various waveforms associated with the dynamic element matching circuit of FIG. 1.
Figure 2B:
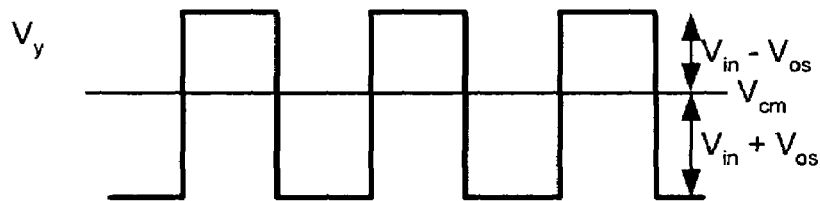
Figure 2C:
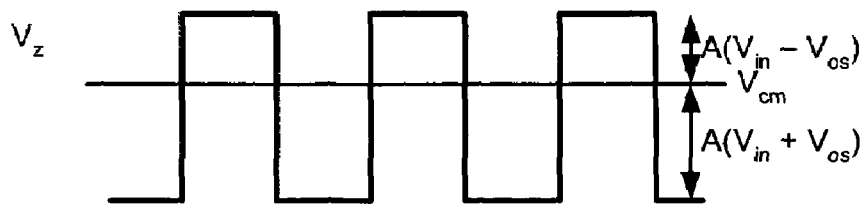
Figure 2D:
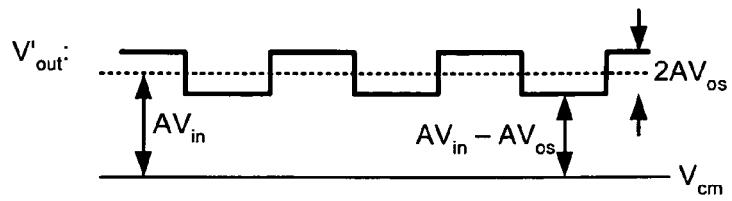
Figure 2E:
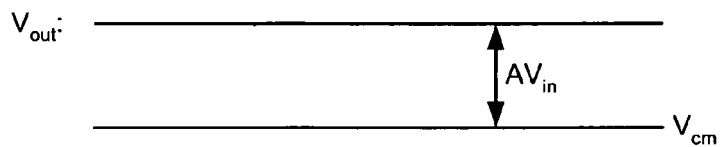
Figure 3C:
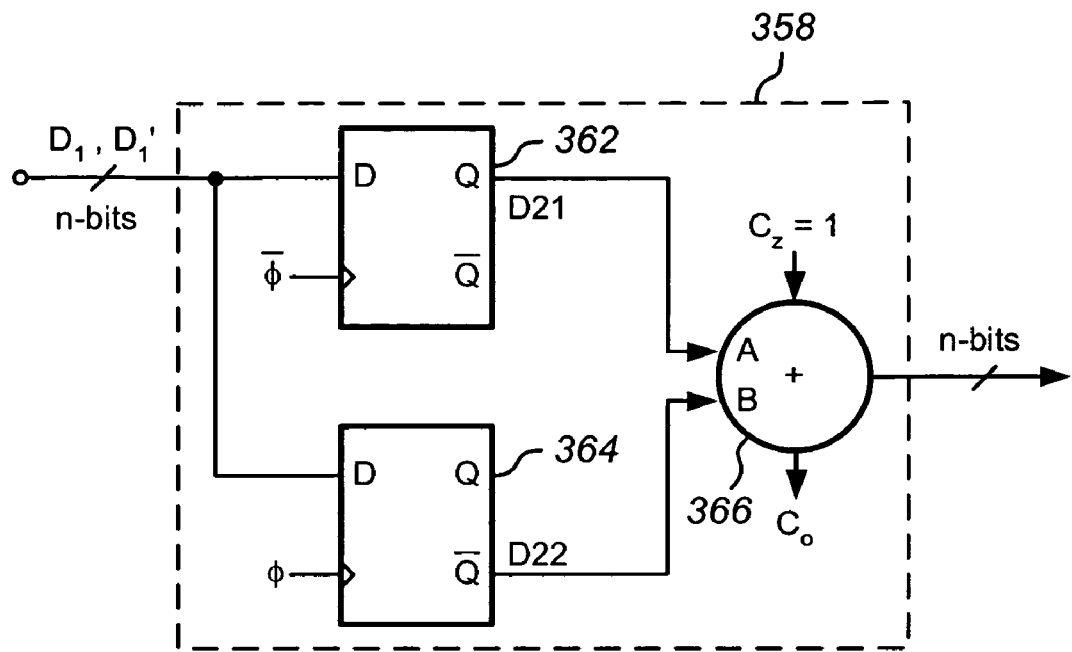
FIG. 3C illustrates an offset cancellation circuit according to one embodiment of the present invention.

FIG. 3C illustrates a simplified version of offset cancellation circuit 358 according to one embodiment of the present invention. This recognizes that rather than mimicking the analog inverting (output chopping) and filtering in the digital domain, another approach can be used. Digital codes D1 and D1' include a stream of digital numbers corresponding to the positive and negative values (or vice versa) of FIG. 2C. Digital version of the average signal (with offsets removed) can be obtained by subtracting the inverted value D1' from the non-inverted value D1 (or vice versa) and divide the result by 2. The function performed by offset cancellation circuit 358 corresponds to those performed by the output chopper switch 106 and the low-pass filter 108.

One embodiment of a digital offset cancellation circuit 358 is shown in FIG. 3C. It includes a first D flip-flip 362, a second D flip-flop 364, and a summing circuit 366. First flip-flop 362 is configured to output a first digital value D21 at positive output Q when enabled by the clock signal at the second (negative, or inverse) clock phase Φ'. First digital value D21 corresponds to digital code D1 (or D1'). Second flip-flop 364 is configured to output a second digital value D22 at inverted output Q' when enabled by the clock signal at the first clock phase Φ. Second digital value D22 is a complement of digital code D1 (or D1'). Summing circuit 366 includes at least one adder 367 (see FIG. 3E). The adder 367 includes a first XOR gate 382 that receives inputs A and B and a second XOR gate 384 coupled to the first XOR gate 382 and output the sum S of the inputs A and B. The adder 367 further includes first and second AND gates 386 and 388 and an OR gate 380 to output a carry output Co.

Although two flip-flops are illustrated in FIG. 3C, those skilled in the art will appreciate that the number of flip-flops used for the offset cancellation circuit 358 will correspond to the number of bits used for the digital codes. The outputs of these additional flip-flops will be connected to summing circuit 366 at the appropriate bit position.

Summing circuit 366 obtains the two's complement of digital code D1' (or D1) by adding 1 to second digital value D22. Summing circuit 366 then adds the two's complement of D1' (or D1) and first digital value D21 [or digital code D1 (or D1')] to remove the offset components. The resulting value is a digital code corresponding to $2A*V_{in}$. To divide by 2, the carry-out of the adder 367 is chosen as the MSB (Most Significant Bit) of the final output code, and dropping the LSB (Least Significant Bit). As a result of the division, digital output code $D_{out}$ corresponding to $A*V_{in}$ is obtained with the offset components removed.

Figure 3D:
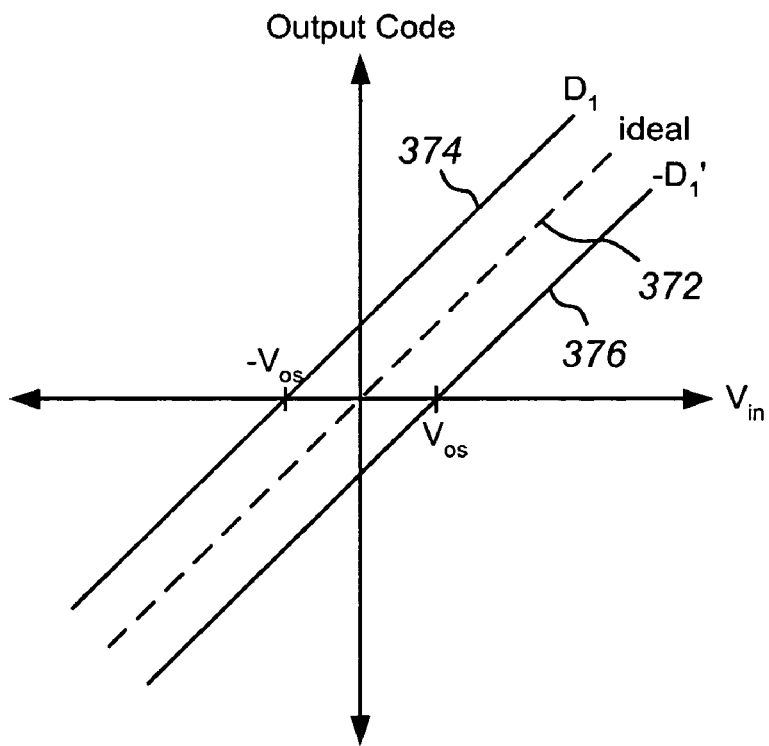
FIG. 3D illustrates a transfer function associated with the data conversion system.
Figure 3E:
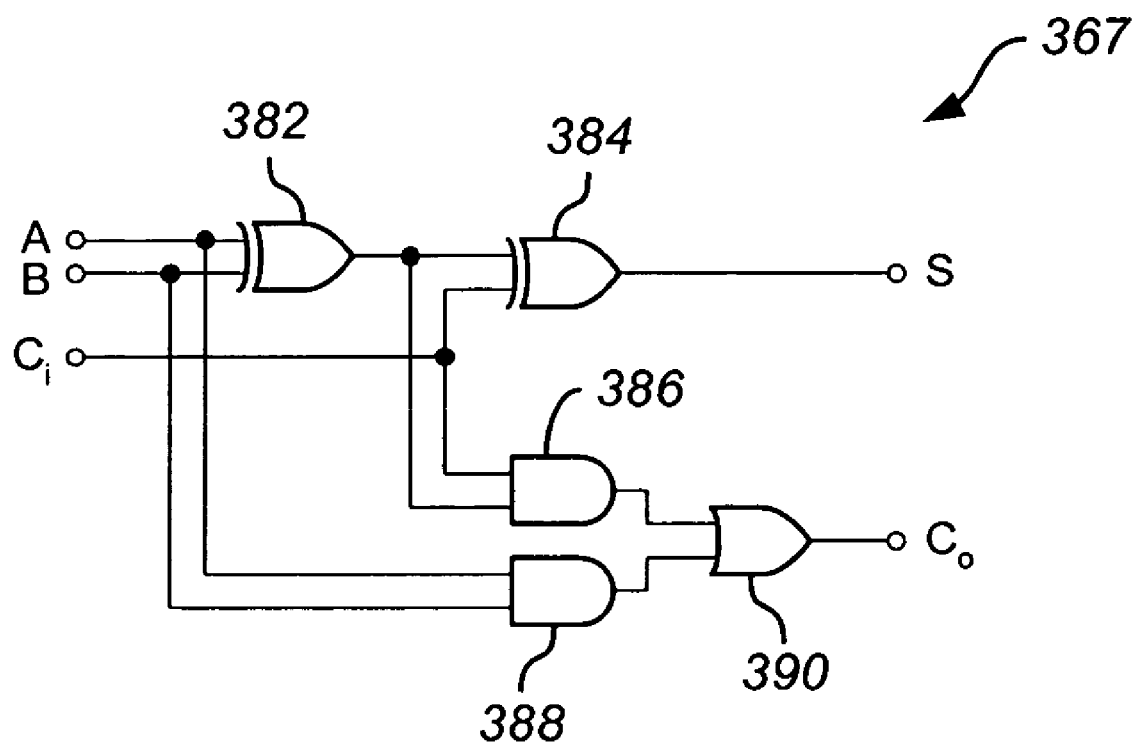
FIG. 3E illustrates an adder according to one embodiment of the present invention.

FIG. 3D illustrates a transfer function associated with the data conversion system 300. The X-axis represents the magnitude of the input signal (or input voltage). The Y-axis represents the magnitude of the output signal (or output voltage). A line 372 is an ideal transfer function without any offset component. A line 374 is a transfer function corresponding to digital code D1 (or D1'). A line 376 is a transfer function corresponding to −D1' (or −D1). Combining these two transfer functions 374 and 376 results in removing the offset components and obtaining a transfer function that substantially resembles the ideal transfer function.

Figure 4A:
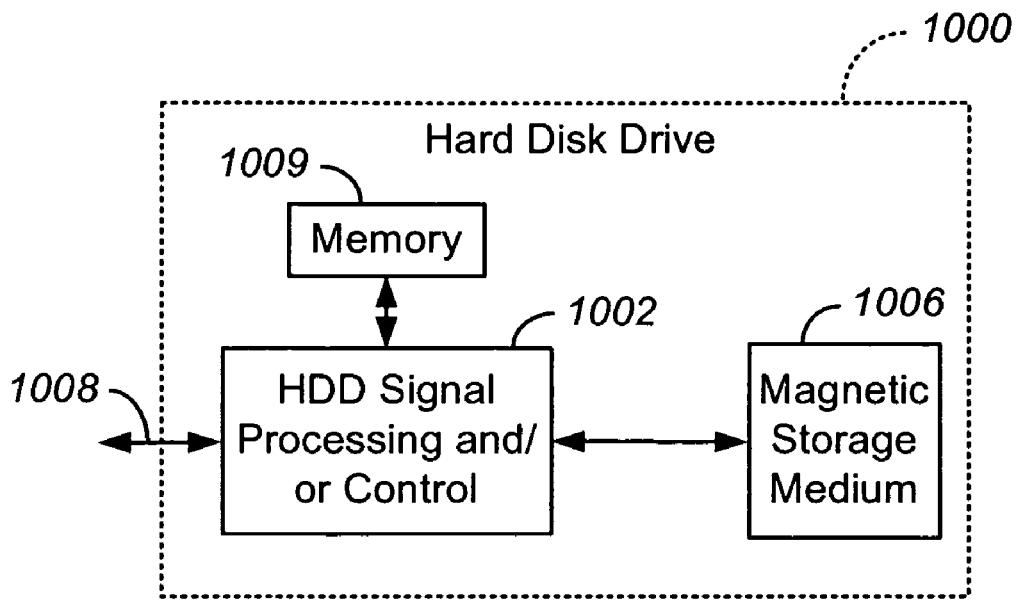
FIGS. 4A-4H show various devices in which the present invention may be embodied.

Referring now to FIGS. 4A-4G, various exemplary implementations of the present invention are shown. Referring to FIG. 4A, the present invention may be embodied in a hard disk drive 1000 (HDD). The present invention may implement either or both signal processing and/or control circuits, which are generally identified in FIG. 4A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Figure 4B:
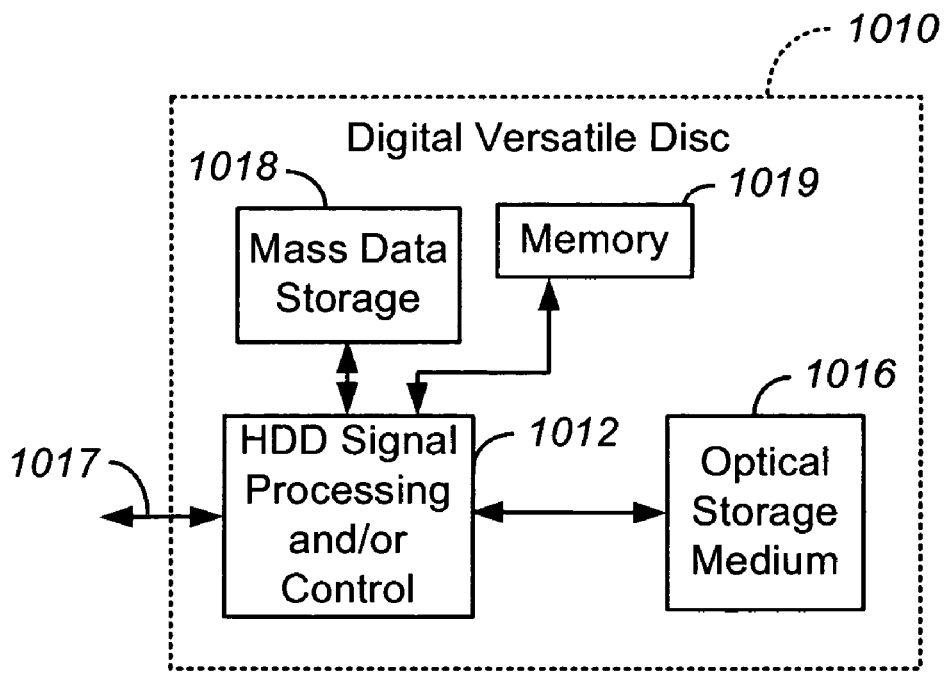

Referring now to FIG. 4B, the present invention may be embodied in a digital versatile disc (DVD) drive 1010. The present invention may implement either or both signal processing and/or control circuits, which are generally identified in FIG. 4B at 1012, and/or mass data storage 1018 of DVD drive 1010. Signal processing and/or control circuit 1012 and/or other circuits (not shown) in DVD drive 1010 may process data, perform coding and/or encryption, perform calculations, and/or format data that is read from and/or data written to an optical storage medium 1016. In some implementations, signal processing and/or control circuit 1012 and/or other circuits (not shown) in DVD drive 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD drive 1010 may communicate with mass data storage 1018 that stores data in a nonvolatile manner. Mass data storage 1018 may include a hard disk drive (HDD) such as that shown in FIG. 4A. The HDD may be a mini HDD that includes one or more platters having a diameter that is smaller than approximately 1.8"DVD drive 1010 may be connected to memory 1019, such as RAM, ROM, low latency nonvolatile memory such as flash memory, and/or other suitable electronic data storage.

Figure 4C:
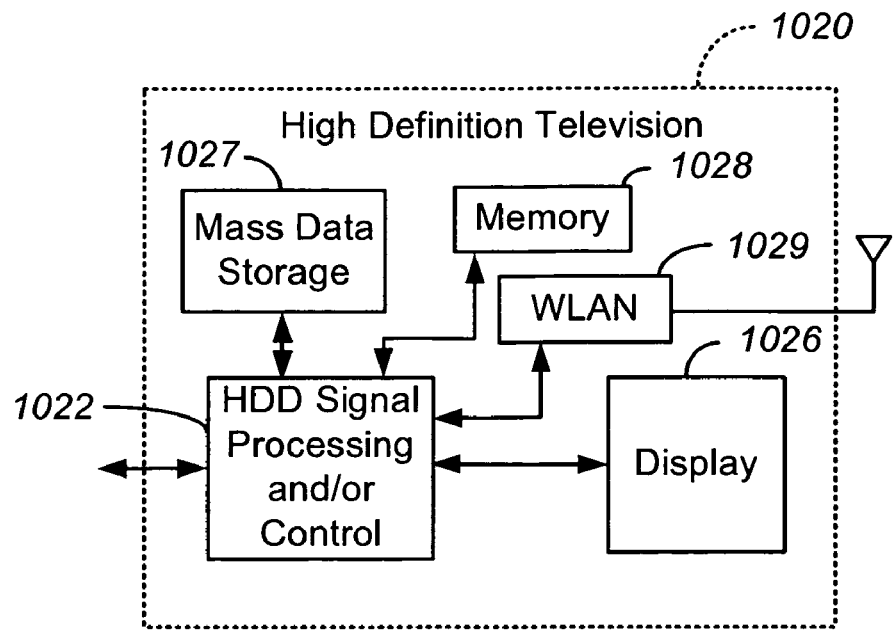

Referring now to FIG. 4C, the present invention may be embodied in a high definition television (HDTV) 1020. The present invention may implement either or both signal processing and/or control circuits, which are generally identified in FIG. 4C at 1022, a WLAN interface 1029 and/or mass data storage 1027 of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via the WLAN interface 1029.

Figure 4D:
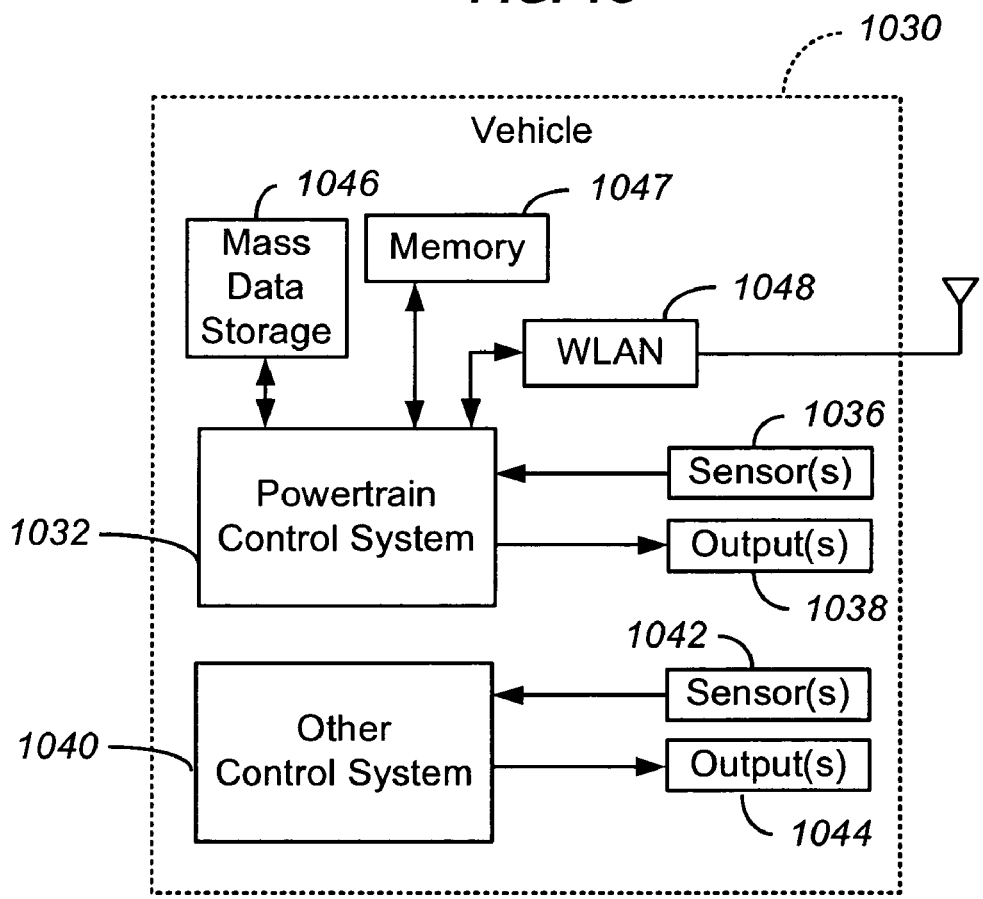

Referring now to FIG. 4D, the present invention implements a control system of a vehicle 1030, a WLAN interface 1048 and/or mass data storage 1046 of the vehicle control system. In some implementations, the present invention implements a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via the WLAN interface 1048. The control system 1040 may also include mass data storage, memory and/or a WLAN interface (all not shown).

Figure 4E:
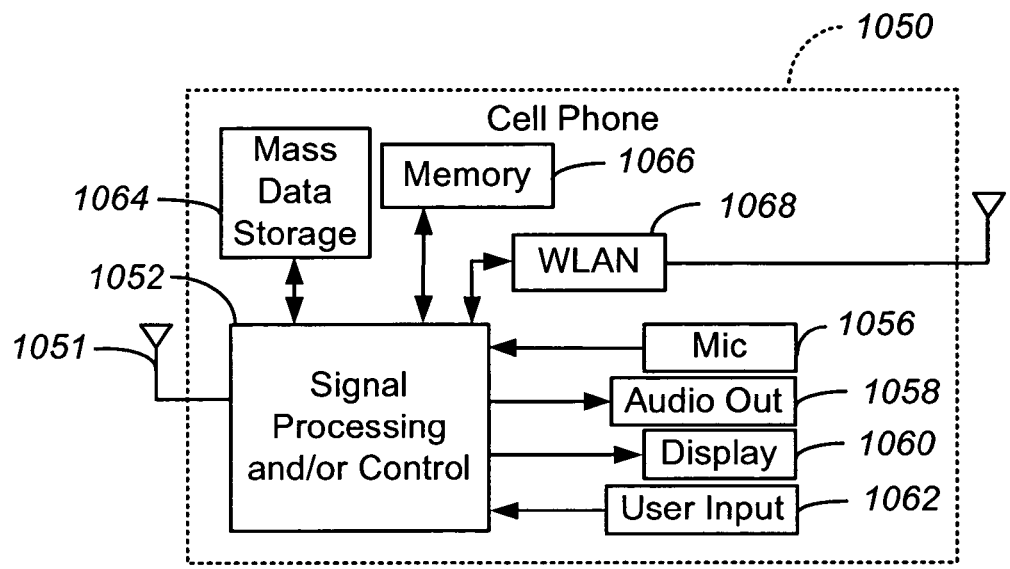

Referring now to FIG. 4E, the present invention may be embodied in a cellular phone 1050 that may include a cellular antenna 1051. The present invention may implement either or both signal processing and/or control circuits, which are generally identified in FIG. 4E at 1052, a WLAN interface 1068 and/or mass data storage 1064 of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via the WLAN network interface 1068.

Figure 4F:
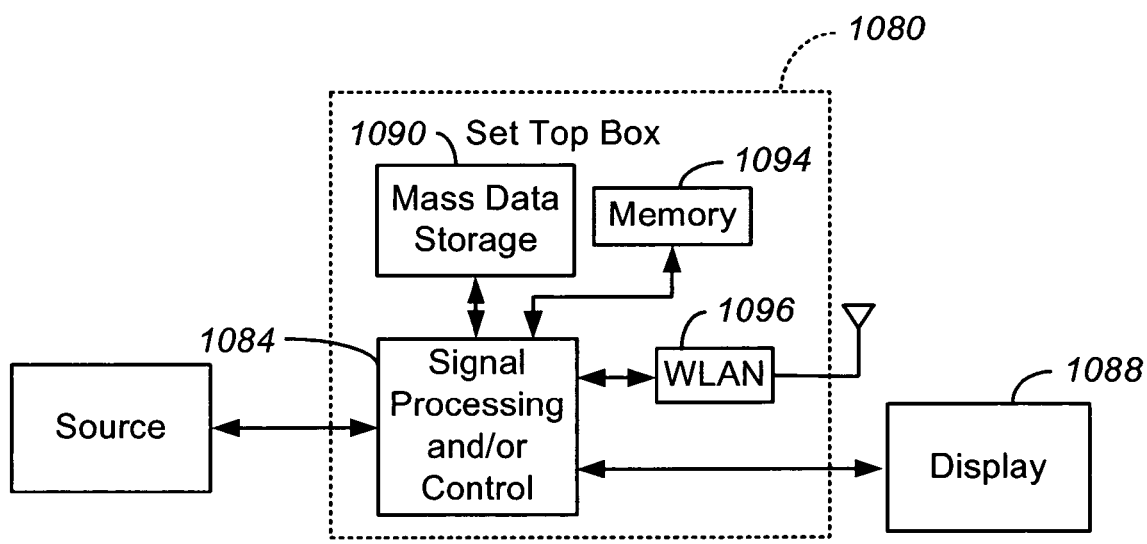

Referring now to FIG. 4F, the present invention may be embodied in a set top box 1080. The present invention may implement either or both signal processing and/or control circuits, which are generally identified in FIG. 4F at 1084, a WLAN interface 1096 and/or mass data storage 1090 of the set top box 1080. Set top box 1080 receives signals from a source such as a broadband source and outputs standard and/or high definition audio/video signals suitable for a display 1088, e.g., a television, monitor and/or other video and/or audio output devices. Signal processing and/or control circuits 1084 and/or other circuits (not shown) of the set top box 1080 may process data, perform coding and/or encryption, perform calculations, format data and/or perform any other set top box functions.

Set top box 1080 may communicate with mass data storage 1090 that stores data in a nonvolatile manner. Mass data storage 1090 may include optical and/or magnetic storage devices for example hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via the WLAN interface 1096.

Figure 4G:
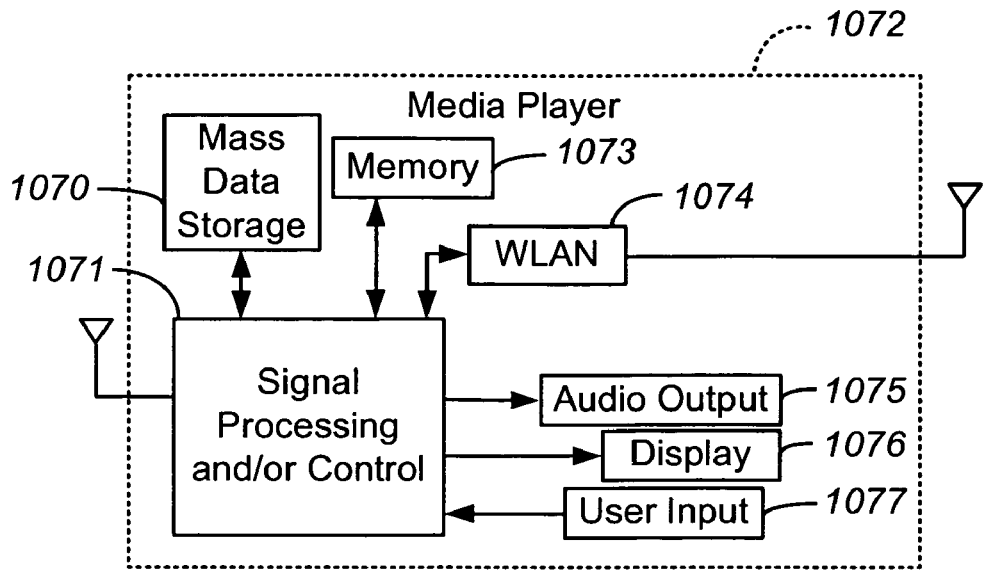

Referring now to FIG. 4G, the present invention may be embodied in a media player 1072. The present invention may implement either or both signal processing and/or control circuits, which are generally identified in FIG. 4G at 1071, a WLAN interface 1074 and/or mass data storage 1070 of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via the WLAN interface 1074.

Figure 4H:
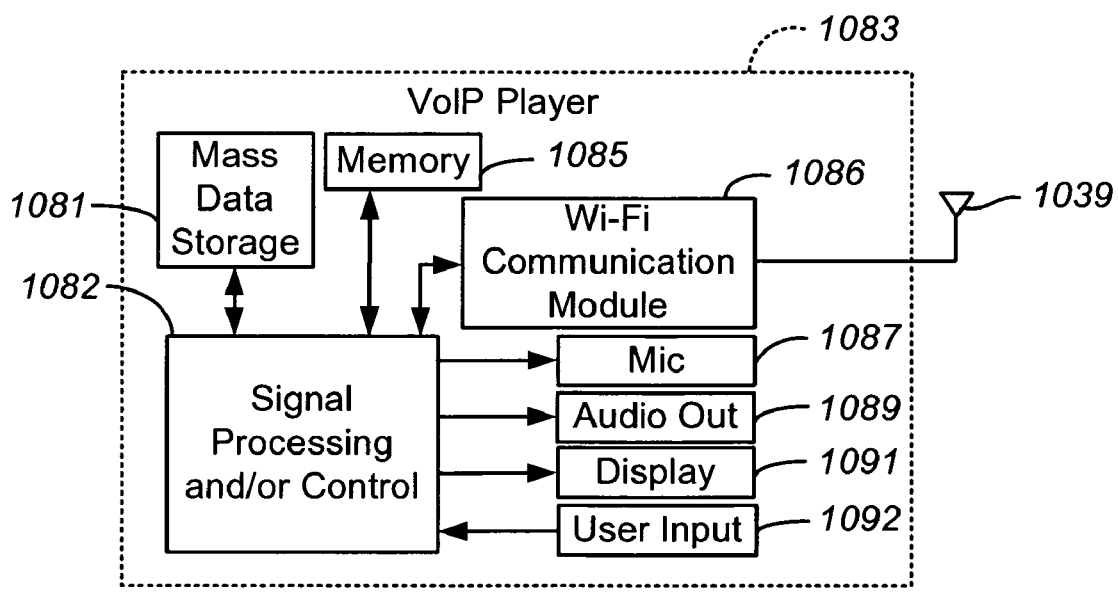

Referring to FIG. 4H, the present invention may be embodied in a Voice over Internet Protocol (VoIP) phone 1083 that may include an antenna 1039. The present invention may implement either or both signal processing and/or control circuits, which are generally identified in FIG. 4H at 1082, a wireless interface and/or mass data storage 1081 of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 1081 that stores data in a nonvolatile manner such as optical and/or magnetic storage devices, for example hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

The above embodiments of the present invention are illustrative and not limitative. Various alternatives and equivalents are possible. The invention is not limited by the type of analog-to-digital converter, amplifier, flip-flop, adder, or other circuits described herein. For example, a subtractor may be used to perform of the adder 367. Nor is the invention limited to any specific type of process technology, e.g., CMOS, Bipolar, or BiCMOS that may be used to manufacture the present disclosure. Other additions, subtractions, or modifications are obvious in view of the present disclosure and are intended to fall within the scope of the appended claims.

What is claimed is:

1. A circuit, comprising:
    a chopper switch to receive an analog input signal and output a first chopped signal of a first polarity during a first clock phase and a second chopped signal of a second polarity during a second clock phase;
    an analog block to receive and process the first and second chopped signals and output first and second processed signals, respectively, the analog block having a first offset voltage associated therewith, the first and second processed signals each including a first offset component associated with the first offset voltage;
    a data converter to receive and convert the first and second processed signals into first and second digital codes, respectively; and
    an offset canceller to receive the first and second digital codes and to remove the first offset components from the first and second digital codes, wherein the offset canceller removes the first offset components based on a complement of the first digital code.

2. The circuit of claim 1, wherein the offset canceller includes:
    a first digital block to receive and output the second digital code;
    a second digital block to receive the first digital code and output the complement of the first digital code; and
    a third digital block to generate the output digital signal by adding a two's complement of the first digital code to the second digital code and dividing a resulting value of the addition by a predetermined integer.

3. The circuit of claim 2, wherein the predetermined integer is 2.

4. The circuit of claim 2; wherein the first digital block is a first flip-flop and the second digital block is a second flip-flop, and the third digital block is a summing circuit.

5. The circuit of claim 4, wherein the third digital block includes an adder to add the two's complement of the first digital code to the second digital code, and wherein the dividing is done by carrying out a Most Significant Bit (MSB) of the resulting value of the addition and dropping a Least Significant Bit (LSB) of the resulting value of the addition.

6. The circuit of claim 2, wherein the first and second digital blocks are first and second D flip-flops, the first D' flip-flop having a non-inverting output in communication with a first input of the summing circuit and an enable node to receive the second clock phase, the second D flip-flop having an inverting output in communication with a second input of the adder and an enable node to receive the first clock phase.

7. The circuit of claim 1, wherein the data converter includes an analog-to digital converter, the data converter having a second offset voltage associated therewith, the first and second digital codes each including a second offset component associated with the second offset voltage.

8. The circuit of claim 7, wherein the offset canceller is configured to remove the second offset components from the first and second digital codes at the time the first offset components are removed from the first and second digital codes.

9. The circuit of claim 8, wherein the analog block includes an amplifier that amplifies the first chopped signal to the first processed signal and the second chopped signal to the second processed signal.

10. A circuit comprising:
    a chopper switch to receive an analog input signal and output a first chopped signal of a first polarity during a first clock phase and a second chopped signal of a second polarity during a second clock phase;
    an analog block to receive the first and second chopped signals and output a first processed signal of the first polarity and a second processed signal of the second polarity, respectively, the analog block having a first offset voltage associated therewith, the first and second processed signals each having a first offset component corresponding to the first offset voltage;
    a data converter to receive and convert the first and second processed signals into first and second digital codes, respectively, the data converter having a second offset voltage associated therewith, the first digital code including a first digital value associated with the first chopped signal, the first offset component associated with the first offset voltage, and a second offset component associated with the second offset voltage, the second digital code including a second digital value associated with the second chopped signal, the first offset component, and the second offset component; and
    an offset canceller to receive the first and second digital codes and output a digital output signal corresponding to the analog input signal and without the first and second offset components, wherein the offset canceller removes the first and second offset components based on a complement of the first digital code.

11. The circuit of claim 10, wherein the offset canceller includes:
    a first digital block to receive and output the second digital code;
    a second digital block to receive the first digital code and output the complement of the first digital code; and
    a third digital block to generate the digital output signal by adding a two's complement of the first digital code to the second digital code and dividing a resulting value of the addition by a predetermined integer.

12. The circuit of claim 11, wherein the predetermined integer is 2.

13. The circuit of claim 11, wherein the first digital block is a first D flip-flop, the third digital block is a summing circuit, the first D flip-flop having a lion-inverting output in communication with a first input of the summing circuit and an enable node to receive the second clock phase, the second D flip-flop having an inverting output in communication with a second input of the summing circuit and an enable node to receive the first clock phase.

14. The circuit of claim 11, wherein the third digital block further includes an adder to add binary 1 to the complement of the first digital code and generate the two's complement of the first digital code.

15. The circuit of claim 14, wherein the dividing is done by carrying out a Most Significant Bit (MSB) of the resulting value of the addition and dropping a Least Significant Bit (LSB) of the resulting value of the addition.

16. The circuit of claim 11, wherein the analog block includes an amplifier that amplifies the first chopped signal to the first processed signal and the second chopped signal to the second processed signal, wherein the first digital value of the first digital code corresponds to a value of the first chopped signal that has been amplified by the amplifier, and the second digital value of the second digital code corresponds to a value of the second chopped signal that has been amplified by the amplifier.

17. The circuit of claim 11, wherein the offset canceller has a subtractor to subtract the first digital code from the second digital code and a divider to divide a resulting value of the subtraction by a predetermined integer.

18. A method comprising:
chopping an analog input signal to output a first chopped signal of a first polarity during a first clock phase and a second chopped signal of a second polarity during a second clock phase;
passing the first and second chopped signals through an analog block and outputting first and second analog signals, respectively, the analog block having a first offset voltage associated therewith, the first and second analog signals each including a first offset component associated with the first offset voltage;
converting the first and second analog signals into first and second digital codes, respectively; and
removing the first offset components from the first and second digital codes based on a complement of the first digital code.

19. The method of claim 18, wherein the removing includes:
providing complement of the first digital code; and
adding a two's complement of the first digital code to the second digital code and dividing a resulting value of the addition by a predetermined integer.

20. The method of claim 19, wherein said adding includes adding binary 1 to the complement of the first digital code, wherein the predetermined integer is 2.

21. The method of claim 20, wherein the dividing comprises carrying out a Most Significant Bit (MSB) of the resulting value of the addition and dropping a Least Significant Bit (LSB) of the resulting value of the addition.

22. The method of claim 18, wherein said converting has a second offset voltage associated therewith, the first and second digital codes each including a second offset component associated with the second offset voltage.

23. The method of claim 22, further comprising removing the second offset components from the first and second digital codes at the time the first offset components are removed from the first and second digital codes.

24. The method of claim 23, further comprising amplifying the first chopped signal to produce the first analog signal and the second chopped signal to produce the second analog signal.

25. The method of claim 18, further comprising subtracting the first digital 2 code from the second digital code and dividing a resulting value of the subtraction by a predetermined integer.

26. A method comprising:
chopping an analog input signal to produce a first chopped signal of a first polarity during a first clock phase and a second chopped signal of a second polarity during a second clock phase;
passing said first and second chopped signals through an analog block and outputting a first analog signal of the first polarity and a second analog signal of the second polarity, respectively, the analog block having a first offset voltage associated therewith, the first and second analog signals each having a first offset component corresponding to the first offset voltage;
passing the first and second analog signals through a converter and generating first and second digital codes, respectively, the converter having a second offset voltage associated therewith, the first digital code including a first digital value associated with the first chopped signal, the first offset component associated with the first offset voltage, and a second offset component associated with the second offset voltage, the second digital code including a second digital value associated with the second chopped signal, the first offset component, and the second offset component; and
substantially canceling the first and second offset components from said digital codes based on a complement of the first digital code.

27. The method of claim 26, wherein the substantially canceling includes:
providing the complement of the first digital code; and
adding a two's complement of the first digital code to the second digital code and dividing a resulting value of the addition by a predetermined integer.

28. The method of claim 27, wherein said adding includes adding binary 1 to the complement of the first digital code.

29. The method of claim 27, wherein the dividing comprises carrying out a Most Significant Bit (MSB) of the resulting value of the addition and dropping a Least Significant Bit (LSB) of the resulting value of the addition.

30. The method of claim 29, further comprising amplifying the first chopped signal to produce the first analog signal and the second chopped signal to produce the second analog signal.

31. The method of claim 26, wherein the substantially canceling includes: subtracting the first digital code from the second digital code and dividing a resulting value of the subtraction by 2.

* * * * *

UNITED STATES PATENT AND TRADEMARK OFFICE
CERTIFICATE OF CORRECTION

PATENT NO. : 7,358,876 B1  
APPLICATION NO. : 11/505513  
DATED : April 15, 2008  
INVENTOR(S) : Kenneth Thet Zin Oo et al.

Page 1 of 1

It is certified that error appears in the above-identified patent and that said Letters Patent is hereby corrected as shown below:

On the Title Page

In column 2, line 7, under "ABSTRACT", after "The analog" delete "bock" and substitute --block-- in its place.

In the Claims

Column 13, in claim 6, line 2, after "the first" delete "D'" and substitute --D-- in its place.

Column 13, in claim 7, line 2, after "includes an" delete "analog-to digital" and substitute --analog-to-digital-- in its place.

Column 14, in claim 13, line 3, after "flip-flop having a" delete "lion-inverting" and substitute --non-inverting-- in its place.

Column 16, in claim 25, line 2, after "the first digital" delete "2".

Signed and Sealed this

Second Day of September, 2008

JON W. DUDAS  
*Director of the United States Patent and Trademark Office*